United States Patent [19]

Crowman et al.

[11] Patent Number: 4,557,044

[45] Date of Patent: Dec. 10, 1985

[54] ELECTRICAL CONNECTOR CLINCHING MEANS

[75] Inventors: Stanley W. T. Crowman, Dillsburg; Bryan J. Dornes, Hershey; Edward J. Paukovits, Jr., Hummelstown; Richard V. Spong, Etters; Robert J. Talarico, Camp Hill, all of Pa.

[73] Assignee: AMP Incorporated, Harrisburg, Pa.

[21] Appl. No.: 705,598

[22] Filed: Feb. 26, 1985

[51] Int. Cl.⁴ .............................................. H05K 3/30
[52] U.S. Cl. ........................................ 29/741; 140/105
[58] Field of Search .................... 29/741, 566.3, 33 F, 29/835, 838, 839; 140/105

[56] References Cited

U.S. PATENT DOCUMENTS 4,125,136 11/1978 Olcese et al. ...................... 140/105
4,138,785  2/1979 Dearborn ............................ 29/741

Primary Examiner—Carl E. Hall
Attorney, Agent, or Firm—Jay L. Seitchik

[57] ABSTRACT

A clinching plate for supporting a circuit board to be loaded with electrical connectors by means of a robot or a pick-and-place machine, comprises a plurality of clinching units set in openings in the plate. The units comprise pairs of slides having clinching ears for clinching a pair of posts at each end of each connector to the board to hold the connectors in place while the board is transported to a soldering station. One clinching unit is provided for each connector and each unit is operated by means of an individual drive cylinder under the control of the microprocessor of the mother machine.

10 Claims, 13 Drawing Figures

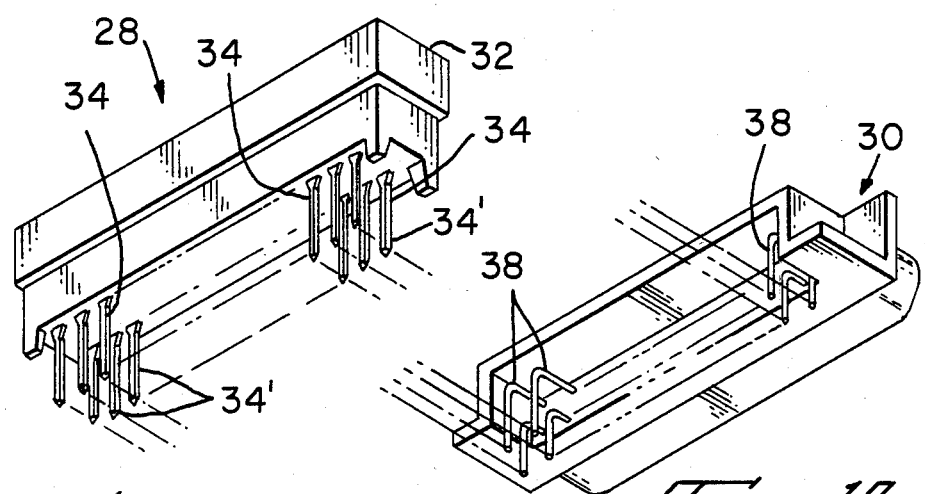
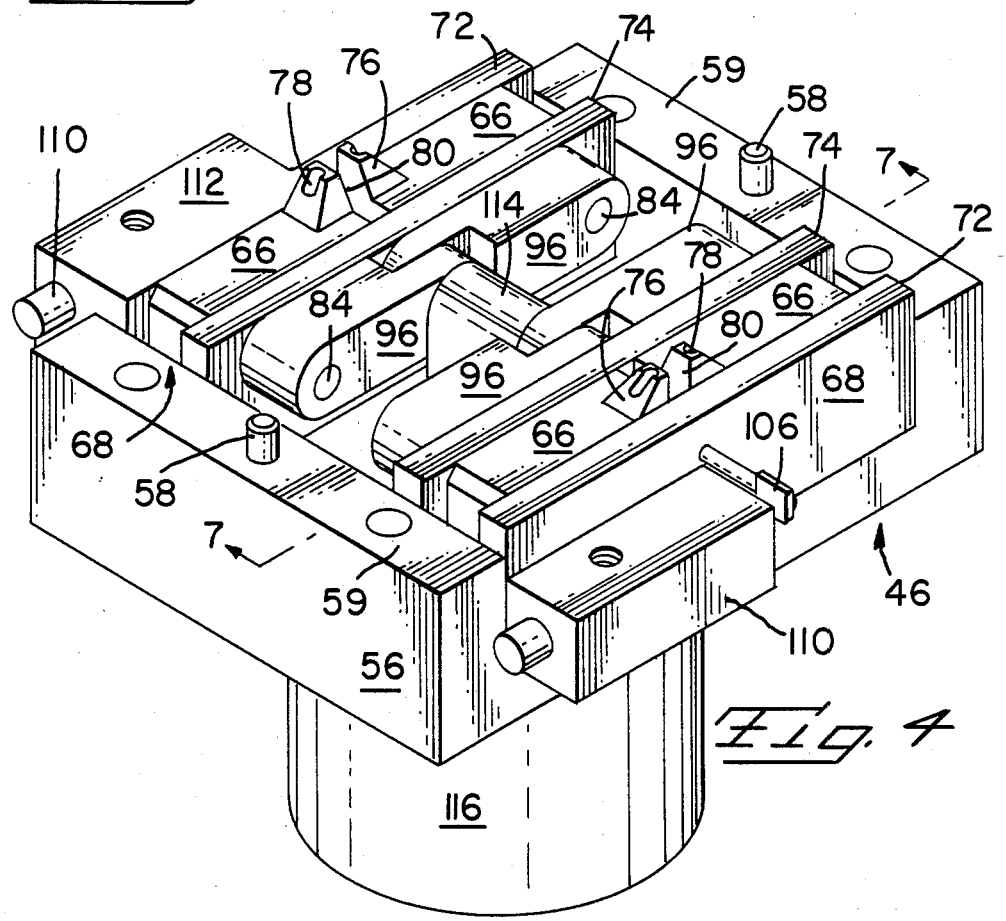

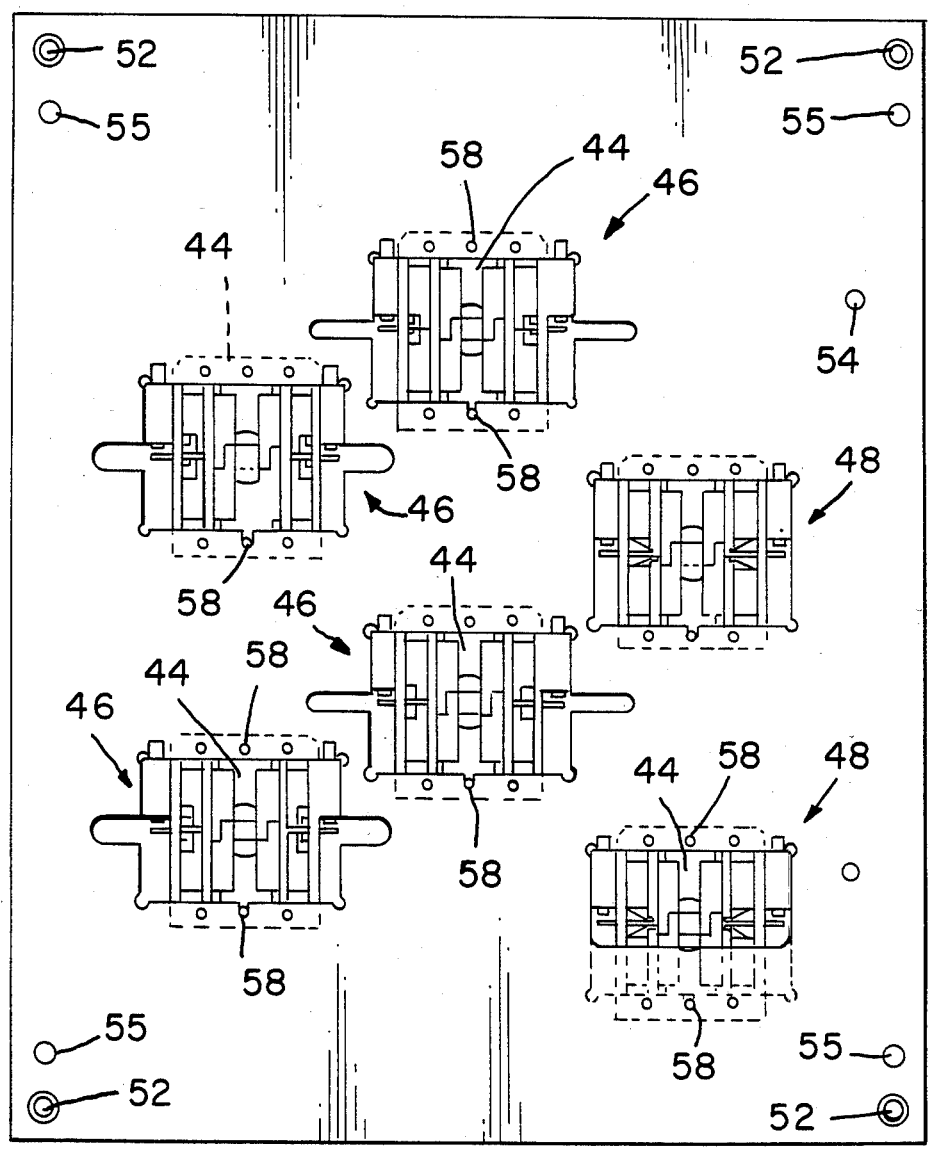
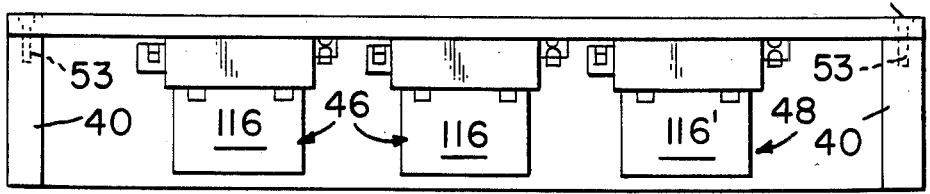

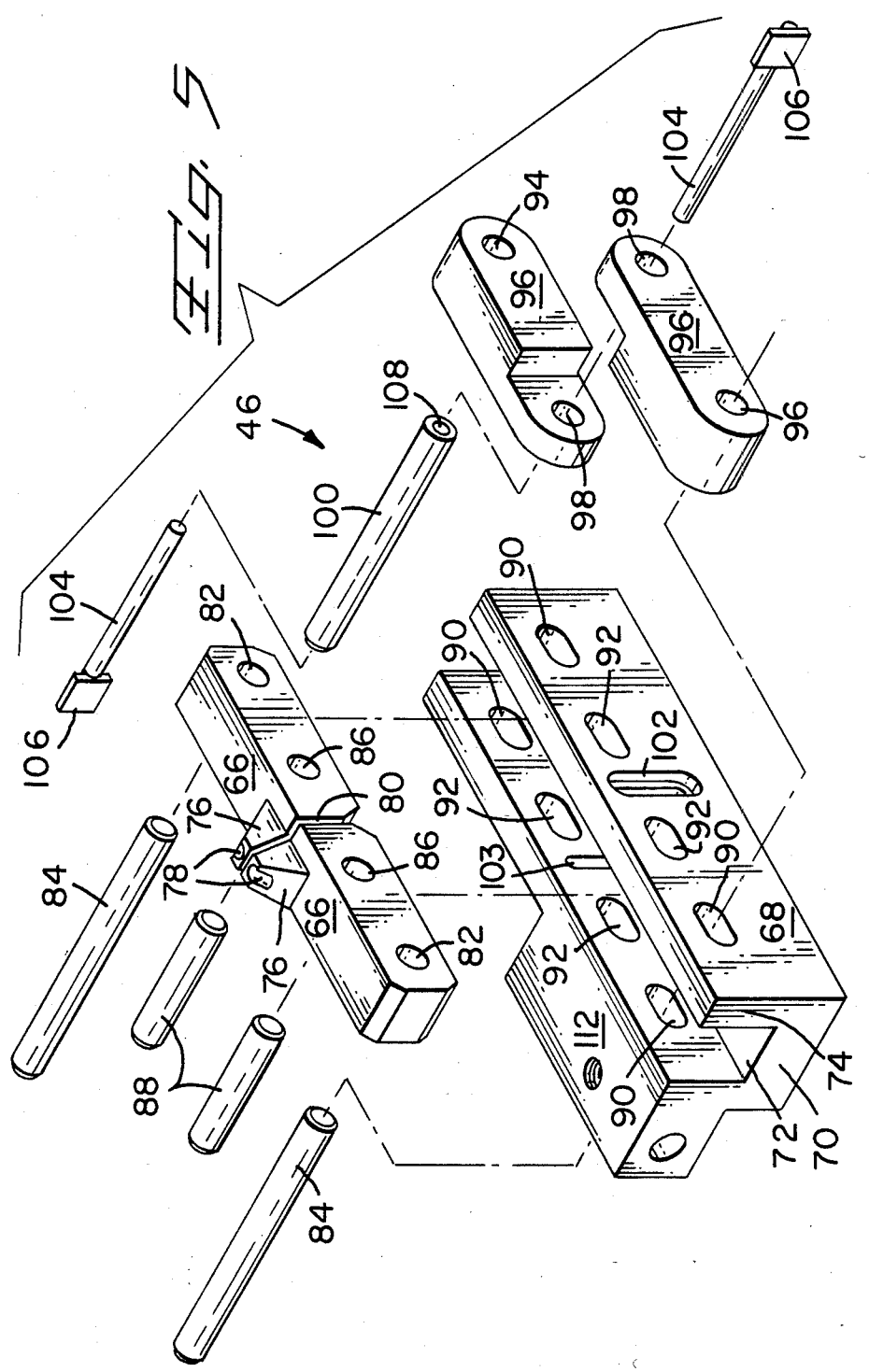

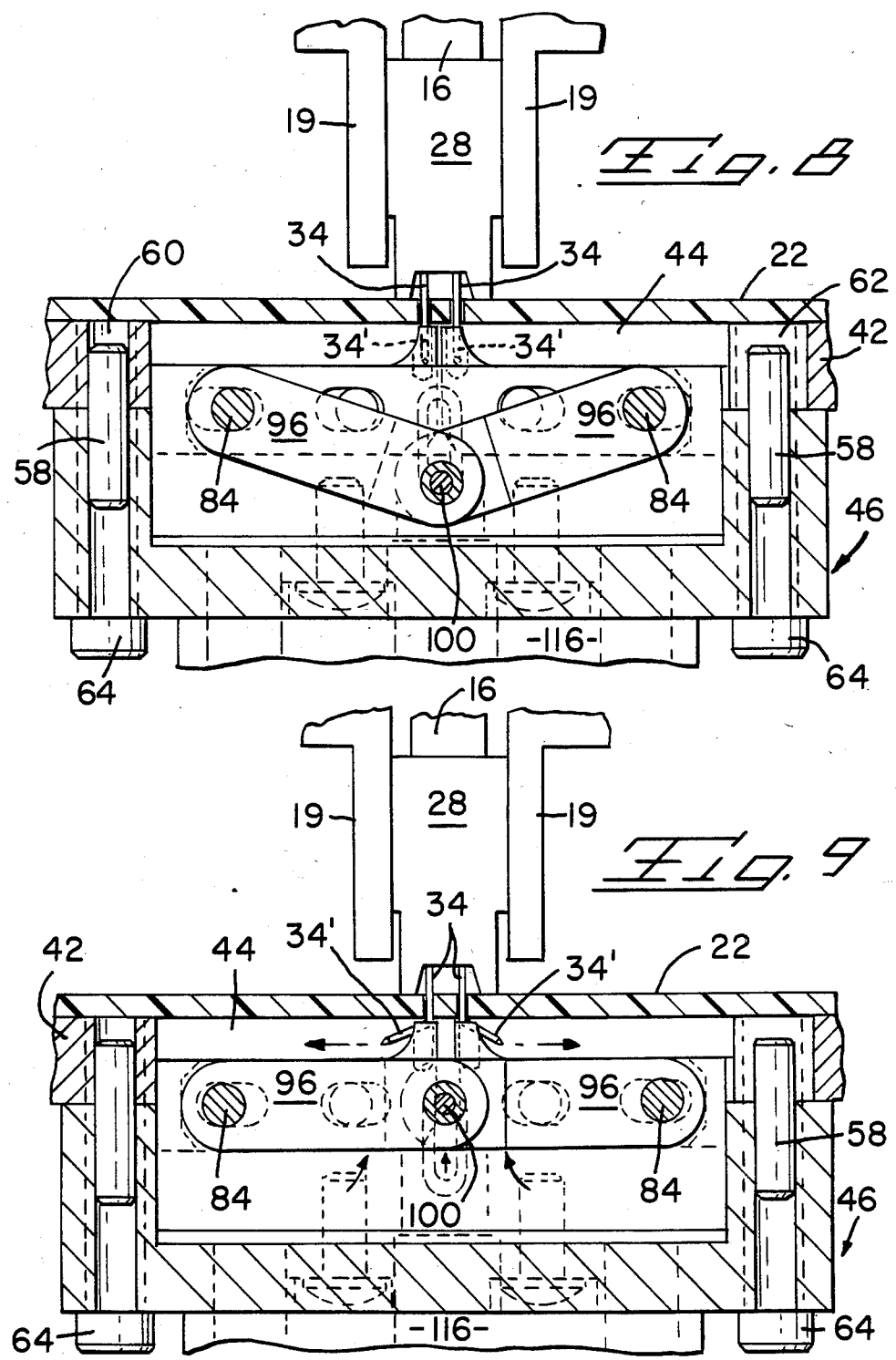

ELECTRICAL CONNECTOR CLINCHING MEANS

This invention relates to a clinching device for provisionally securing to a circuit board, electrical connectors placed on one side of the board, and each having rows of connecting posts extending through holes in the board so that a portion of each post projects from the other side of the board. The invention also concerns a clinching unit for such a device.

There is described in U.S. patent application No. 663,790, filed Oct. 23, 1984, which is hereby incorporated herein by reference, a gripper head for attachment to an arm of a robot or to a pick-and-place machine, for transferring the connectors from a connector pickup station to a circuit board, the gripper head being arranged to insert the posts through the holes in the circuit board so that portions of the posts of the connectors project from said other side of the board. When the connectors have been so placed on the board, the board is transported to a soldering station at which the projecting portions of the posts are soldered to conductors upon said other side of the circuit board. The problem arises, however, of provisionally securing the connectors to the board so that they are not displaced therefrom during such transport.

According to the invention, therefore, a clinching device for provisionally securing to a circuit board, electrical connectors which have been placed on one side of the board and each of which has rows of connecting posts extending through holes in the board so that a portion of each post projects from the other side of the board, comprises a plate for supporting the circuit board in a horizontal plane. The plate has openings each of which receives a clinching unit for clinching adjacent post portions of one of the connectors towards said other side of the board. Each clinching unit may comprise pairs of slides, each slide having a clinching ear projecting towards said plane. The slides of each pair may be driven between a post portion receiving, first position and a clinching, second position, by means of a pair of toggle links each having one end pivoted to one slide of the pair, the other end of each link being pivoted to a main pin movable towards and away from said plane by drive means.

In use of the clinching device, the plate for supporting the circuit board is horizontally positioned on a frame in the work area of the robot or the pick-and-place machine. By actuating the drive means according to the program of the mother machine, each connector can be provisionally secured to the board, against displacement therefrom when the board is transported to a soldering station.

Each unit may be provided with an individual piston and cylinder device for driving the main pin thereof towards and away from the circuit board according to the program when the board is positioned on the frame.

Means may be provided for sensing the position of each pair of slides and for reporting their position to the microprocessor of the mother machine.

For a better understanding of the invention, and to show how it may be carried into effect, reference will now be made by way of example to the accompanying drawings in which:

FIG. 1A is a diagrammatic perspective view of a first form of electrical connector;

FIG. 1B is a diagrammatic perspective view of another form of electrical connector;

FIG. 2 is a plan view of an assembly comprising a clinching device provided with clinching units for provisionally securing to a circuit board, electrical connectors which have been placed on one side of the board and each of which has rows of connecting posts extending through holes in the board so that a portion of each post projects from the other side of the board;

FIG. 3 is an end view of FIG. 2;

FIG. 4 is a perspective view of a first post-clinching unit of the clinching device;

FIG. 5 is a perspective exploded view of part of the post-clinching unit shown in FIG. 4;

FIGS. 8 and 9 are views of part of the unit as shown in FIG. 7 illustrating the operation thereof;

Figure 1:
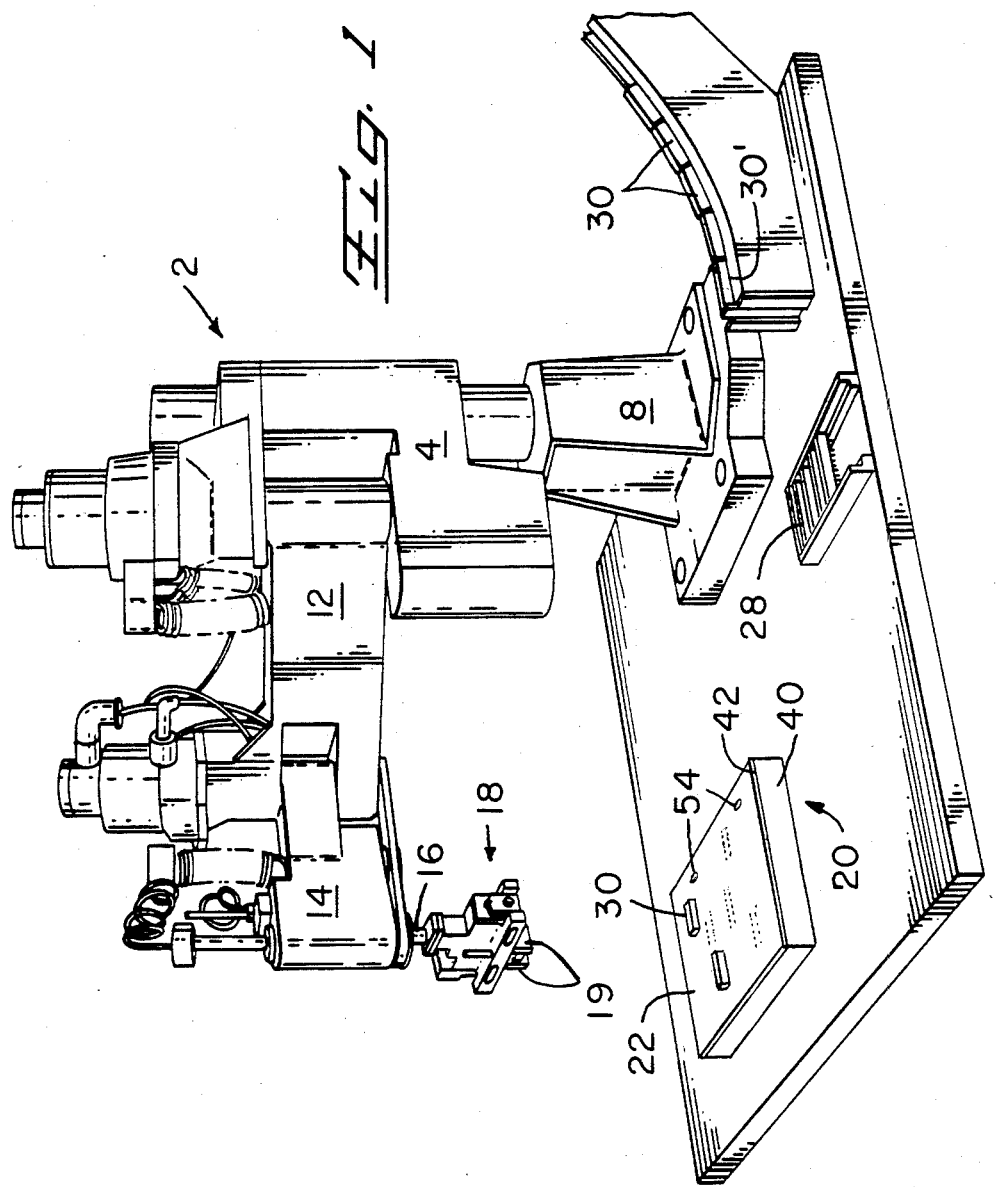
FIG. 1 is a diagrammatic perspective view of a robot in use in the assembly of electrical connectors to a circuit board.

As shown in FIG. 1, a robot 2 comprises a body 4 mounted for rotation about, and movement along, the axis of a vertical shaft 6 in a stand 8 secured to a worktable 10. Mounted on the body 4 for rotation about a vertical axis is a first arm 12 carrying at its end remote from the body 4 a second arm 14 which is rotatable relative to the arm 12, also about a vertical axis. A shaft 16 which is rotatable about a vertical axis and which is also extensible and retractable along such axis depends from the arm 14 at its end remote from the arm 12. The body 4 is clamped, prior to use of the robot 2, in a desired angular position and in a desired vertical position with respect to the shaft 6. The rotation of the arms 12 and 14, and the shaft 16, as well as the axial vertical movement of the shaft 16 are selectively controllable by means of a microprocessor (not shown) in accordance with a predetermined program.

A gripper head 18 having connector gripper jaws 19 is fixedly mounted on the shaft 16.

An assembly 20 for provisionally securing electrical connectors to a circuit board is mounted on the table 10 and supports, in a fixed position thereon, a circuit board 22. At respective positions on the worktable 10, spaced from one another and from the support, are electrical connector pickup stations 24 and 26 containing electrical connectors to be placed on the board 22. The station 24 contains connectors 28, the station 26 containing connectors 30 which are different from the connectors 28.

The robot 2 is operated under the control of the microprocessor to swing the head 18 over one of the pickup stations, for example, the station 26, to lower the head 18 to engage the leading connector 30' at the station 26 to cause the jaws 19 to grip that connector, to raise the head 18, to swing it to a position over the board 22, to lower the head 18 to position the connector 30' on the board 22, to cause the jaws 19 to release the connector 30', to raise the head 18 and subsequently to cause the jaws 19 to pick up a connector from the station 24 and position it on the board 22, in a manner similar to that described above with reference with the picking up and placing of the connector 30', and so on. The program ensures that the head 18 is rotated about the vertical axis of the shaft 16 so that it is suitably oriented for each pickup and place operation.

As shown in FIG. 1A, each connector 28 comprises an insulating housing 32 from which depend connecting posts 34 of electrical terminals in the housing 32. The posts 34 are arranged in two parallel rows with each post of one row disposed opposite to a post of the other row.

As shown in FIG. 1B, each connector 30 comprises an insulating housing 36 from which extend posts 38 of electrical terminals in the housing 36, the posts 38 extending from the housing in two rows. However, the posts of the rows are offset from one another so that each post 38 of one row lies between two posts of the other row rather than being opposite to a post of the other row.

As shown in FIGS. 2 and 3, the assembly 20 comprises a rectangular frame 40, e.g., of aluminum, supporting a clinching device comprising a metal plate 42 in which are rectangular openings 44 receiving respective post-clinching units 46 and 48, the units 46 being arranged for clinching posts of the connectors 28 and the units 48 being arranged for clinching posts of the connectors 30. The plate 42 is of the same size and configuration as the board 22 and the board 22 is arranged to be mounted to the plate 42 by means of polarizing dowel pins 54 on the plate 42, received in corresponding openings in the board 22. The plate also has through-holes 55 for use in bolting it to the board 22, if required. The plate 42 is secured to the frame by means of dowel pins 53 thereon which engage in holes 52 with bushings therein, provided at the corners of the plate 42. The units 46 and 48 are located so as to lie beneath the connectors 28 and 30, respectively, when these have been placed on the board 22 by the robot 2, in accordance with its program.

Figure 6:
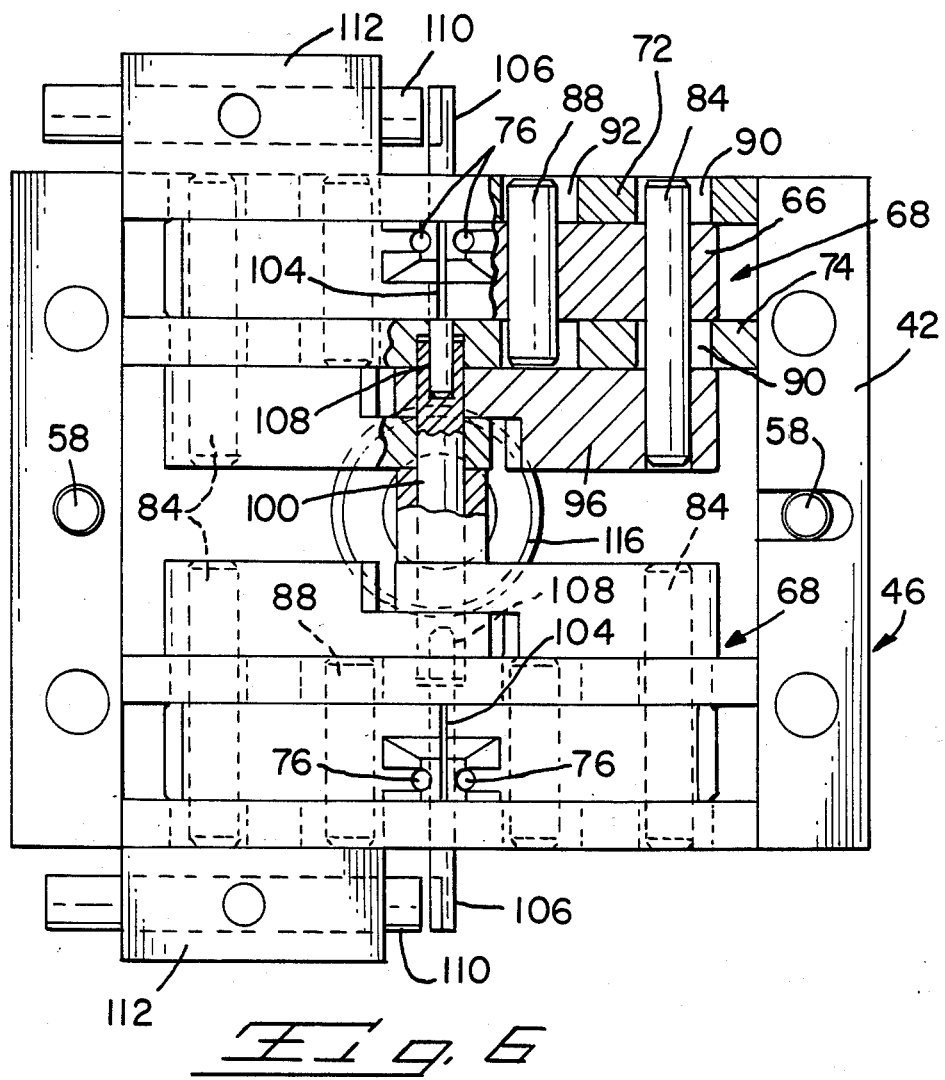
FIG. 6 is a plan view, shown partly in section, of the unit shown in FIG. 4.
Figure 7:
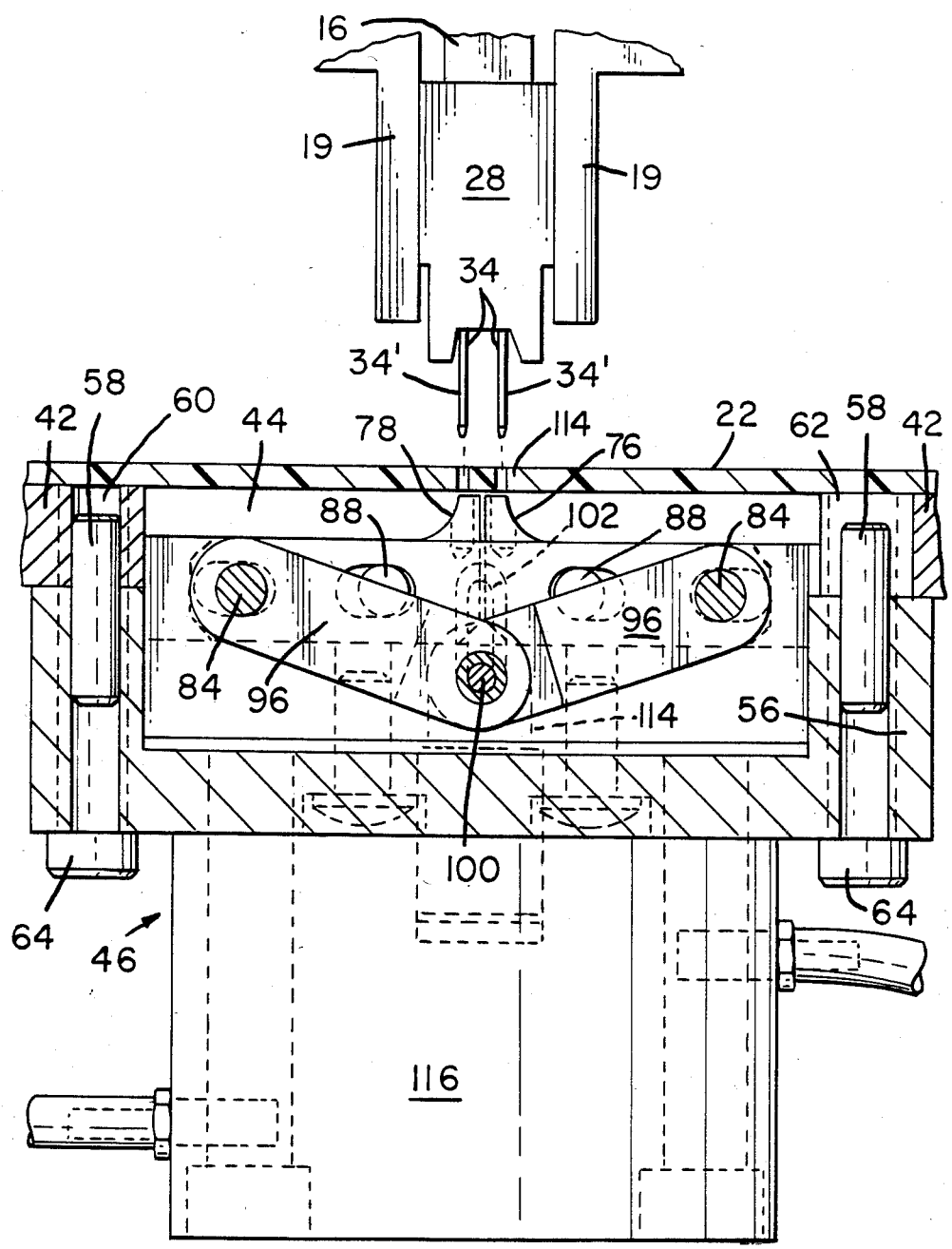
FIG. 7 is a view taken on the lines 7—7 of FIG. 4 and showing part of a circuit board supported over the unit and an electrical connector about to be placed on the board by a pair of gripper jaws of a robot.

A unit 46 will now be described with reference to FIGS. 4 to 7. As shown in FIG. 4, each unit 46 comprises a substantially rectangular subframe 56 provided with polarizing dowel pins 58 for reception in openings 60 and 62 in the plate 42 for locating the unit 46 with respect to the plate 42 prior to securing it thereto by means of screws 64 (FIG. 7). The pins 58 extend from coplanar board receiving surfaces 59 of the frame 56. In the frame 56 are two pairs of slides 66, each pair being mounted for horizontal sliding movement in a slideway 68 having a base 70 and sidewalls 72 and 74, as best seen in FIG. 5. Each slide 66 of a pair has a clinching ear 76 at its end adjacent to the other slide 66 of the pair, each ear 76 having a recess 78 for receiving a post 34 of a connector 28. The recesses 78 of each pair of ears 76 open in a horizontal direction, away from each other, the recesses 78 also opening upwardly. The slides 66 of each pair have plain vertical end abutment faces 80 facing one another. Each slide 66 has at its end remote from its face 80 a bore 82 receiving a pivot pin 84, and at its opposite end, a bore 86 receiving a pivot pin 88, the pins 84 also being received in opposite elongate slots 90 in the sidewalls 72 and 74 of the slideway 68 and the pins 88 being received in opposite elongate slots 92 in the sidewalls 72 and 74. Each pin 84 is further received in a bore 94 in one end of a link 96 positioned adjacent to the sidewall 74 and thus between the two slideways 68. In its opposite end, each link has a further bore 98 receiving a main pivot pin 100 extending through vertical slots 102 in the respective sidewalls of the slideways 68 to provide a toggle linkage for operating the slides 66. Shafts 104 each carrying a reflector 106 are fixedly received in respective longitudinal bores 108 provided in opposite ends of the pin 100. A photoelectric sensor 110 is contained in a housing 112 formed integrally with the sidewall 72 of each slideway 68. The main pin 100 which, as best seen in FIG. 6, is common to the links 96 associated with both of the slideways 68, has one end slidably received in each slot 102 in the sidewall 74 of each slideway 68, each rod 104 extending through a slot 103 in the wall 72 of said slideway so that the reflector 106 on the shaft 104 is positioned opposite to the corresponding sensor 110 when the slides 66 are positioned as shown in FIG. 4. Centrally between the slideways 68, the pin 100 extends rotatably through the piston rod 114 of a pneumatic piston and cylinder device 116 secured to the bottom of the subframe 56.

When a connector 28 is, as shown in FIG. 7, to be placed by the jaws 19 of the robot 2 on the upper side of the board 22 with portions 34' of the posts 34 of the connector 28 inserted through holes 114 in the board 22 to project from the lower side thereof, the piston rod 114 of the device 116 is maintained in a lowered position, as shown in FIG. 7, so that the links 96 of each toggle linkage are in a broken position whereby the pins 84 are positioned at the inner ends of the slots 90, that is to say at the ends thereof nearest to the slots 102 whereby the faces 80 of each pair of slides 66 of the unit 46 are in abutment so that the ears 76 of these slides are adjacent to one another so as to receive the pin portions 34' in the recesses 78 as shown in FIG. 8 as the jaws 19 descend. The recesses 78 of the ears 76 of one pair of slides 66 of the unit 46 receive opposite post portions 34' at one end of the connector 28, the recesses 78 of the ears 76 of the other pair of slides 66 of the unit 46 receiving opposite post portions 34' at the other end of the connector 28. The piston and cylinder device 116 is now actuated to advance its piston rod 114 to move the links 96 of each toggle linkage towards a straightened position as shown in FIG. 9, whereby the links 96 are caused to push the pins 84, and thereby the slides 66, in an outward direction, that is to say away from each other. The ears 76 are caused to clinch the post portions 34' of the two pairs of posts 34 of the connector 28 towards the underside of the board 22, as shown in FIG. 9, provisionally to secure the connector 28 to the board 22. The device 116 is then caused to retract its piston rod 114 to move the slides 66 of two pairs of slides 66 and thus the ears 76 thereon towards one another again in preparation for a further clinching operation when a further board 22 has been placed by the robot 2 on the plate 42. The pins 88 in cooperation with the slots 92 serve to guide the slides 66 of each pair in their rectilinear movement towards and away from one another.

As the main pin 100 reaches its uppermost position in the slots 102 of the slideways 68, the reflectors 106 are brought into alignment with the photoelectric sensors 110 so as to cause the latter to signal to the microprocessor of the robot 2 that the clinching operation has been completed in respect of both pairs of post portions 34' of the connector 28.

Figure 10:
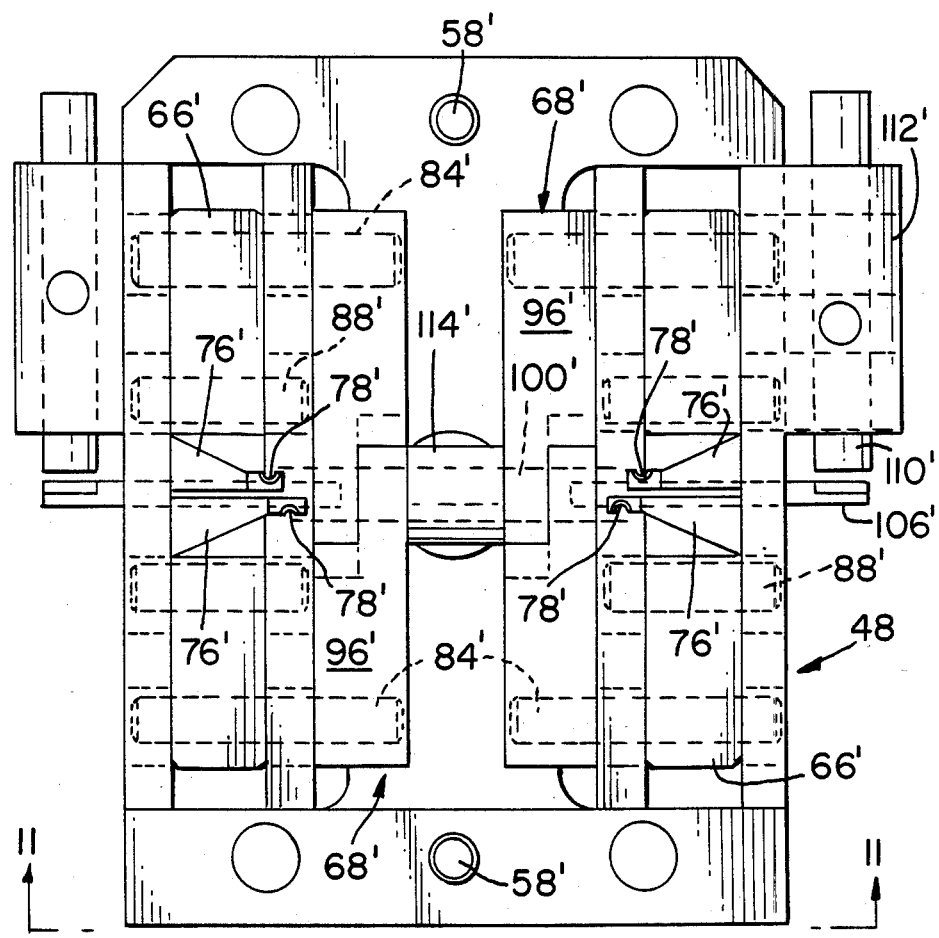
FIG. 10 is a plan view of a second post-clinching unit of the clinching device.
Figure 11:
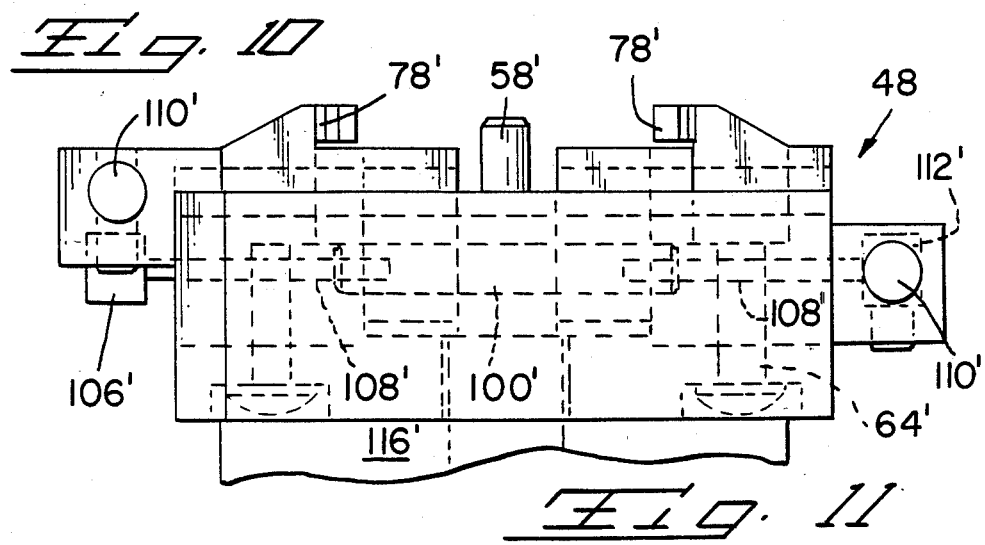
FIG. 11 is a view taken on the lines 11—11 of FIG. 10.

Reference will now be made to FIGS. 10 and 11, which show one of the clinching units 48. Each clinching unit 48 is constructed in the same way as a clinching unit 46 excepting in that the clinching ears are offset from one another to compensate for the offset arrangement of the post portions 38 of the connectors 30. The unit 48 will not therefore be described herein excepting in respect of the clinching ears. In FIGS. 10 and 11, those parts of the unit 48 which are the same as corresponding parts of the units 46 bear the same reference numerals as those used above, but with the addition of a prime symbol.

In each unit 48, the ears 76' of each pair of slides 66' are so arranged that their recesses 78' are offset from one another in a direction at right angles to the direction of movement of the slides 66', so that one recess 78' of each pair of ears 76' can receive an end portion of a post 38 in one row, and the other recess 78' of said pair of ears can receive the end portion of an adjacent post 38 in the other row.

We claim:

1. A clinching device for provisionally securing to a circuit board, electrical connectors which have been placed on one side of the board and each of which has rows of connecting posts extending through holes in the board so that a portion of each post projects from the other side of the board, the assembly comprising:
   a plate for supporting the circuit board in a horizontal plane;
   a plurality of openings formed in the plate each for receiving the post portions of one of the connectors;
   a post-clinching unit mounted in each opening for clinching pairs of adjacent ones of the post portions towards said other side of the board;
   pairs of slides provided in each post-clinching unit, each slide having a post-clinching ear projecting towards said plane, the slides of each pair being movable towards and away from one another between a post portion receiving, first position and a clinching, second position;
   links connecting the slides of each pair and being connected to a main pin which is movable between first and second positions to displace the slides of said pair between their first and their second positions; and
   drive means connected to said unit and to said main pin to move it between its first and second positions.

2. A clinching device as claimed in claim 1, wherein the slides of each pair are guided for movement in a direction parallel to said plate, and have abutment surfaces to limit their movement towards one another, the clinching ears being adjacent to said surfaces.

3. A clinching device as claimed in claim 2, wherein each clinching ear of each slide of each pair has a post portion receiving recess, the recesses opening towards said plane and also at right angles thereto in opposite directions.

4. A clinching device as claimed in claim 1, wherein each unit comprises a frame receiving two parallel slideways in opposed parallel relationship, a pair of the slides being mounted in each slideway, said links being mounted between the slideways and said main pin being connected to the piston rod of a piston and cylinder device secured to the frame.

5. A clinching device as claimed in claim 1, wherein each main pin is connected to a reflector for cooperation with a photoelectric sensor when the slides have been moved to their second position.

6. A clinching device as claimed in claim 1, wherein the slides of each pair are guided for movement along a rectilinear path and the clinching ears of these slides are offset from one another in a direction normal to said path.

7. A clinching device as claimed in claim 1, wherein each link of each pair of slides is connected at one end to a respective one of the slides and at its other end to said main pin, the slides of each pair being received in a slideway having a slot receiving an end of said main pin and extending at right angles to said plate.

8. A post-clinching unit adapted to be mounted in an opening in a plate for supporting a circuit board, the unit comprising:
   a frame having coplanar peripheral surfaces for abutment with portions of said plate surrounding said opening;
   a pair of rectilinear slideways mounted in spaced, parallel and opposite relationship in said frame;
   a pair of elongate slides mounted in each slideway for longitudinal movement towards and away from one another and having abutment faces limiting their movement towards one another;
   a clinching ear projecting from each slide, adjacent to its abutment face, beyond the plane of said coplanar surfaces;
   a drive unit mounted to said frame; and
   linkage means connecting said drive unit to each of said slides to move the slides of each pair towards and away from one another.

9. A unit as claimed in claim 8, wherein said linkage means comprises a pair of toggle linkages each having a first and a second link, each link of one toggle linkage being pivoted at one end to a respective slide of one pair, at a position remote from the clinching ear thereof and being pivoted at its other end to a main pin which is slidable in a slot in said slideway which slot extends perpendicularly to the direction of movement of the slides, the main pin being drivably coupled to the drive means.

10. A unit as claimed in claim 9, wherein the main pin is connected to a reflector for cooperation with a photoelectric sensor mounted to the frame, to sense the relative positions of the slides.

* * * * *